United States Patent
Kabasawa et al.

(10) Patent No.: US 9,384,944 B2
(45) Date of Patent: Jul. 5, 2016

(54) ION IMPLANTER AND ION IMPLANTATION METHOD

(71) Applicant: Sumitomo Heavy Industries Ion Technology Co., Ltd., Tokyo (JP)

(72) Inventors: Mitsuaki Kabasawa, Ehime (JP); Masaki Ishikawa, Ehime (JP); Yusuke Ueno, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 0 days.

(21) Appl. No.: 14/693,323

(22) Filed: Apr. 22, 2015

(65) Prior Publication Data
US 2015/0311037 A1 Oct. 29, 2015

(30) Foreign Application Priority Data
Apr. 23, 2014 (JP) ................. 2014-089281

(51) Int. Cl.
| | |
|---|---|
| *H01J 37/00* | (2006.01) |
| *H01J 37/317* | (2006.01) |
| *H01J 37/244* | (2006.01) |
| *H01J 37/141* | (2006.01) |
| *H01J 37/147* | (2006.01) |

(52) U.S. Cl.
CPC ........... *H01J 37/3171* (2013.01); *H01J 37/141* (2013.01); *H01J 37/1474* (2013.01); *H01J 37/244* (2013.01); *H01J 2237/14* (2013.01); *H01J 2237/15* (2013.01); *H01J 2237/31701* (2013.01)

(58) Field of Classification Search
USPC ................... 250/396 R, 396 ML, 398, 492.1
See application file for complete search history.

(56) References Cited

FOREIGN PATENT DOCUMENTS

| | | |
|---|---|---|
| JP | H07-003131 U | 1/1995 |
| JP | H10-003873 A | 1/1998 |

*Primary Examiner* — Nicole Ippolito
*Assistant Examiner* — Hanway Chang
(74) *Attorney, Agent, or Firm* — Michael Best & Friedrich LLP

(57) ABSTRACT

A beamline unit of an ion implanter includes a steering electromagnet, a beam scanner, and a beam collimator. The beamline unit contains a reference trajectory of an ion beam. The steering electromagnet deflects the ion beam in an x direction perpendicular to a z direction. The beam scanner deflects the ion beam in the x direction in a reciprocating manner to scan the ion beam. The beam collimator includes a collimating lens that collimates the scanned ion beam in the z direction along the reference trajectory, and the collimating lens has a focus at a scan origin of the beam scanner. A controller corrects a deflection angle in the x direction in the steering electromagnet so that an actual trajectory of the deflected ion beam intersects with the reference trajectory at the scan origin on an xz plane.

16 Claims, 6 Drawing Sheets

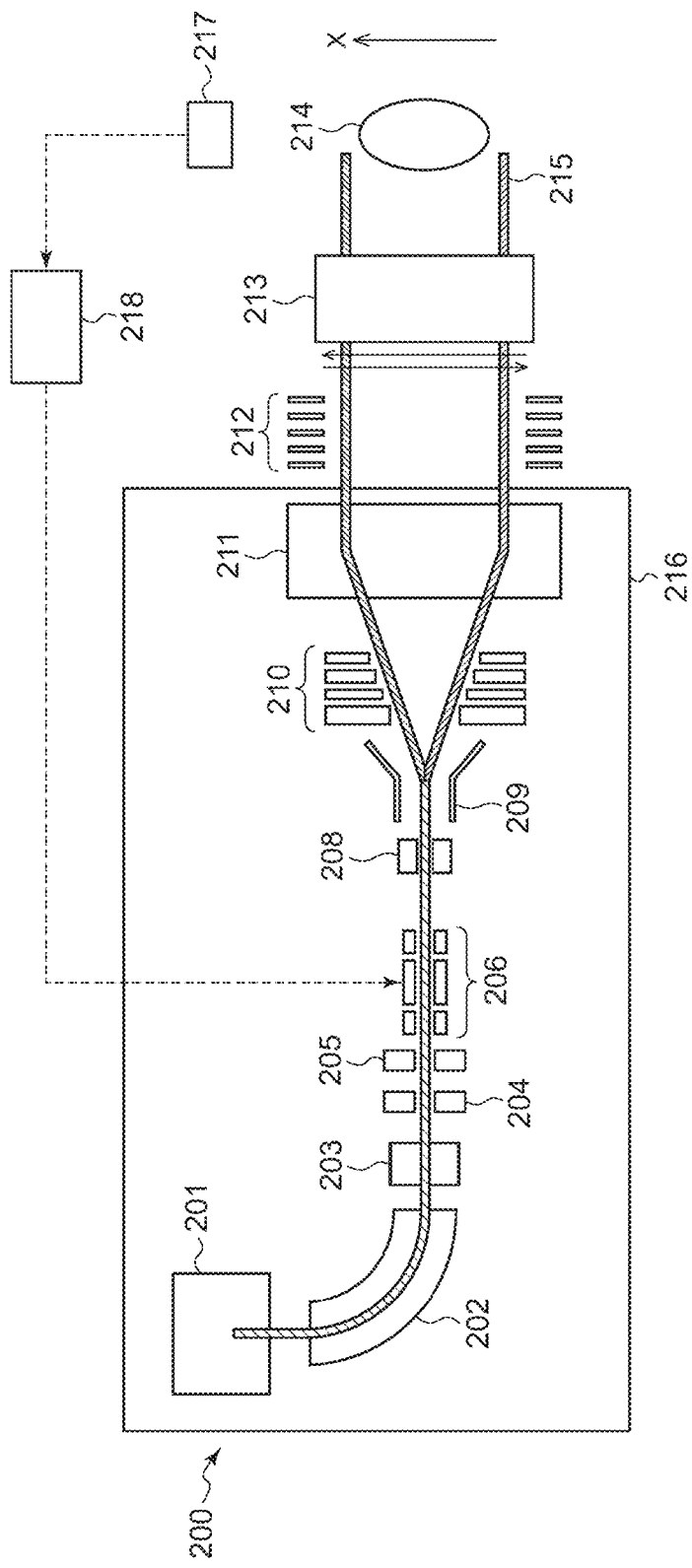

ION IMPLANTER AND ION IMPLANTATION METHOD

RELATED APPLICATION

Priority is claimed to Japanese Patent Application No. 2014-89281, filed on Apr. 23, 2014, the entire content of which is incorporated herein by reference.

BACKGROUND OF THE INVENTION

1. Field of the Invention

The present invention relates to an ion implanter and an ion implantation method.

2. Description of the Related Art

A mechanical scanning type ion implanter having an energy analyzer electromagnet located immediately before an end station is known. In this ion implanter, the energy analyzer electromagnet is configured to provide an ion beam implantation tilt angle to a wafer by means of ion beam deflection thereof.

A beamline of the ion implanter is provided with various beamline components to transport an ion beam from an ion source to a workpiece such as the wafer appropriately. At the time of manufacturing the ion implanter, these beamline components are installed at designed positions as precisely as possible. However, in actual cases, some of the components may be arranged at the installation positions with slight errors. Such installation errors may cause an error (hereinbelow also referred to as a trajectory error) of an actual center trajectory (hereinbelow also referred to as an actual trajectory) of the transported ion beam against a designed center trajectory (hereinbelow also referred to as a reference trajectory) of the ion beam.

For example, consider a case in which a beam adjusting component (e.g., a quadrupole lens) configured to adjust focusing or defocusing of the ion beam is installed in a direction perpendicular to the reference trajectory to slightly deviate from the reference trajectory. When the ion beam is incident to this beam adjusting component along the reference trajectory, the ion beam will pass through a place slightly deviating from a center of the beam adjusting component. Consequently, the ion beam is slightly deflected from the reference trajectory due to a focusing or defocusing effect of the beam adjusting component.

Such a trajectory error may be enlarged during transportation of the ion beam toward the workpiece. For example, the trajectory error may be further enlarged during the transportation when a distance from a position at which the trajectory error occurs to the workpiece is longer. Also, in a case in which several beamline components respectively have the installation errors, the trajectory error may be enlarged by combination thereof even when each of the errors is slight. When the trajectory error is large, an influence on precision of an implantation position or an implantation angle of the ion beam to the workpiece cannot be ignored.

SUMMARY OF THE INVENTION

An illustrative object of an aspect of the present invention is to provide an ion implanter and an ion implantation method that reduce an implantation angle error to a workpiece.

According to an aspect of the present invention, there is provided an ion implanter comprising: a beamline unit comprising: a beam deflector capable of deflecting an ion beam in an x direction; a beam scanner disposed downstream of the beam deflector and capable of deflecting the ion beam in the x direction in a reciprocating manner to scan the ion beam; and a beam collimator disposed downstream of the beam scanner and comprising a collimating lens that collimates the scanned ion beam in a z direction, the collimating lens having a focus at a scan origin of the beam scanner, wherein the beamline unit contains a reference trajectory of the ion beam, the z direction represents a direction along the reference trajectory, and the x direction represents a direction perpendicular to the z direction; and a controller that controls at least the beam deflector of the beamline unit, wherein the controller corrects an x-direction deflection angle in the beam deflector so that an actual trajectory of the ion beam deflected by the beam deflector intersects with the reference trajectory at the scan origin on an xz plane.

According to an aspect of the present invention, there is provided an ion implantation method comprising: deflecting an ion beam in an x direction by using a beam deflector; scanning the deflected ion beam in the x direction by using a beam scanner; and collimating the scanned ion beam in a z direction by using a collimating lens, wherein the x direction is one direction perpendicular to the z direction, and the z direction is a direction along a reference trajectory of the ion beam, wherein the beam scanner deflects the deflected ion beam in the x direction in a reciprocating manner to scan the deflected ion beam, wherein the collimating lens has a focus at a scan origin of the beam scanner, wherein an x-direction deflection angle in the beam deflector is corrected so that the deflected ion beam intersects with the reference trajectory at the scan origin on an xz plane.

Optional combinations of the aforementioned constituting elements, and implementations of the invention in the form of methods, apparatuses, and systems, may also be practiced as additional modes of the present invention.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which:

FIG. 6 is a plan view illustrating a schematic configuration of an ion implanter according to an embodiment of the present invention.

DETAILED DESCRIPTION OF THE INVENTION

Figure 1:
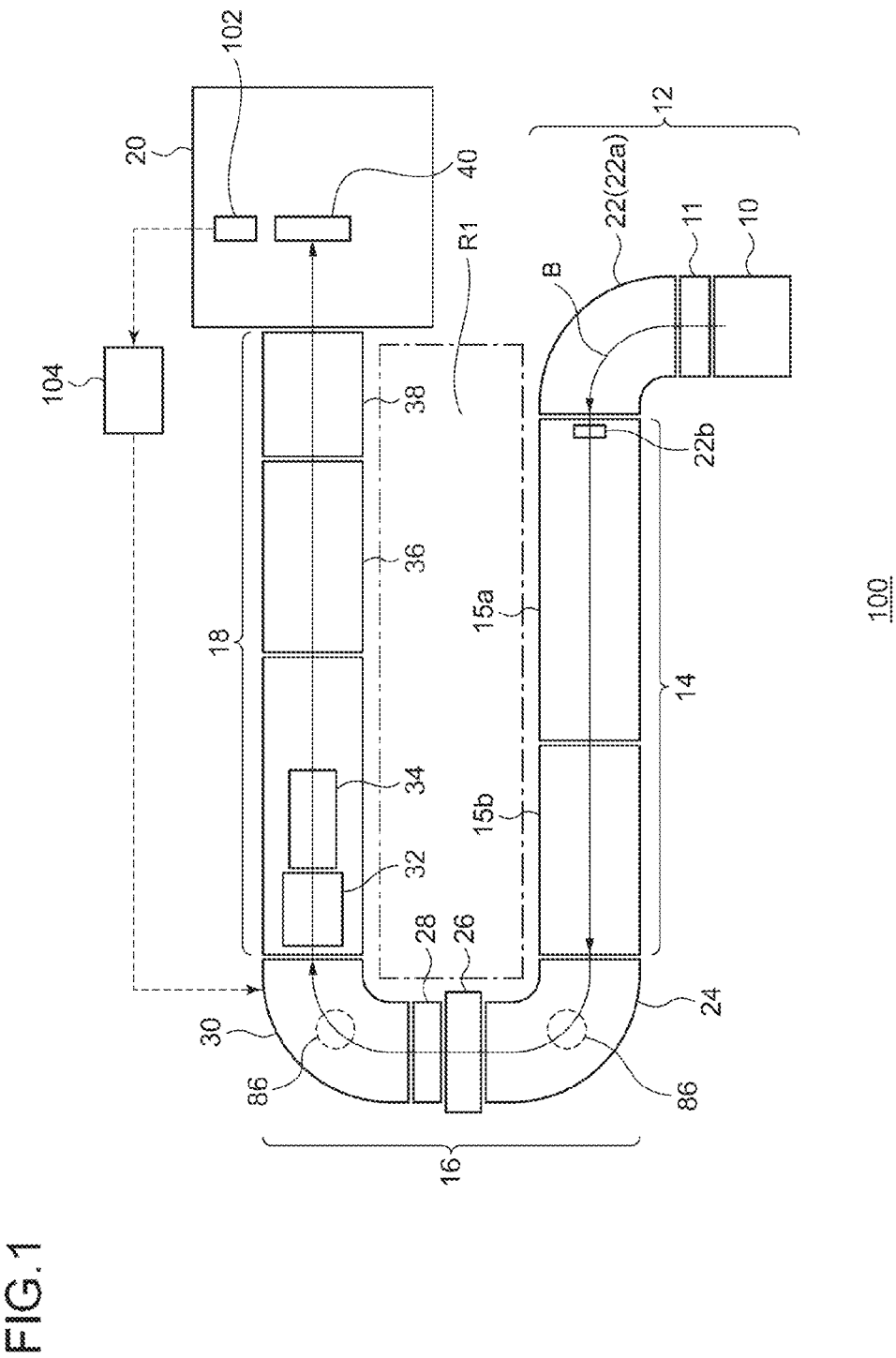
FIG. 1 is a schematic top view of an ion implanter according to an embodiment of the present invention.

The invention will now be described by reference to the preferred embodiments. This does not intend to limit the scope of the present invention, but to exemplify the invention.

Hereinbelow, embodiments of the present invention will be described in detail with reference to the drawings. The same reference sign will be assigned to the same element in the drawings, and duplicate description thereof will not be presented as is appropriate. The configurations described below are merely examples but are not for purposes of limiting the scope of the present invention.

FIG. 1 is a schematic top view of an ion implanter 100 according to an embodiment of the present invention. FIG. 1 shows a layout of components constituting a beamline unit of the ion implanter 100. The beamline unit of the ion implanter 100 includes an ion source 10 and a processing chamber for a workpiece and is configured to transport an ion beam B from the ion source 10 to the workpiece (e.g., a substrate or a wafer 40).

In this document, for convenience of description, a direction along a reference trajectory in the beamline unit is referred to as a z direction, and a direction perpendicular to the z direction is referred to as an x direction. Also, a direction perpendicular to the z direction and the x direction is referred to as a y direction. In the present embodiment, the x direction is a horizontal direction while the y direction is a vertical direction.

Also, this document may include an expression, "an actual beam trajectory intersects with the reference trajectory on a plane (e.g., an xz plane)." The "intersecting" in such an expression means intersecting as seen in a direction (e.g., the y direction) perpendicular to the plane. Thus, the actual beam trajectory and the reference trajectory may slightly deviate in the y direction. In an embodiment in which the "intersecting" occurs in a beam scanner, the actual beam trajectory and the reference trajectory may slightly deviate in the y direction in the range in which the intensity of a deflection electric field of the beam scanner can be regarded to be equal to the intensity when y=0 (a position of the reference trajectory in the y direction). In an embodiment, in a case in which a deviation ratio of the deflection electric field is less than 0.8% or less than 0.4%, for example, the intensities of the deflection electric field can be regarded to be equal.

The ion implanter 100 is applied to a so-to-speak high energy ion implanter. The high energy ion implanter is an ion implanter that includes a radio frequency linear acceleration type ion accelerator and a high energy ion transportation beamline. The high energy ion implanter is configured to accelerate ions generated by the ion source 10 to have high energy, transports the ions along a beamline to the workpiece as the ion beam B, and implants the ions into the workpiece.

As illustrated in FIG. 1, the ion implanter 100 includes an ion beam generation unit 12 that generates ions and separates the ions by mass, a high energy multistage linear acceleration unit 14 that accelerates an ion beam so as to become a high energy ion beam, a beam deflection unit 16 that bends a trajectory of the high energy ion beam in a U shape, a beam transportation line unit 18 that transports the high energy ion beam to the wafer 40, and a substrate processing/supplying unit 20 that uniformly implants the transported high energy ion beam into the semiconductor wafer.

The ion beam generation unit 12 includes the ion source 10, an extraction electrode 11, and a mass analyzer 22. In the ion beam generation unit 12, a beam is extracted from the ion source 10 through the extraction electrode 11 and is accelerated, and the extracted and accelerated beam is subjected to a mass analysis by the mass analyzer 22. The mass analyzer 22 includes a mass analysis magnet 22a and a mass analysis slit 22b. There is a case in which the mass analysis slit 22b is disposed directly behind the mass analysis magnet 22a. However, in the embodiment, the mass analysis slit 22b is disposed inside the entrance of the next component, the high energy multistage linear acceleration unit 14.

Only the ion species necessary for the implantation are selected as a result of the mass analysis using the mass analyzer 22, and the ion beam of the selected ion species is led to the next high energy multistage linear acceleration unit 14. The high energy multistage linear acceleration unit 14 includes a first linear accelerator 15a including a plurality of stages of basic radio frequency resonators for high energy ion implantation. The high energy multistage linear acceleration unit 14 may include a second linear accelerator 15b including a plurality of additional stages of radio frequency resonators for super high energy ion implantation. The direction of the ion beam accelerated by the high energy multistage linear acceleration unit 14 is changed by the beam deflection unit 16.

The high energy ion beam that exits from the radio frequency (AC-type) high energy multistage linear acceleration unit 14 for highly accelerating the ion beam has a certain range of energy distribution. For this reason, in order to scan and collimate the high energy ion beam emitted from the high energy multistage linear acceleration unit 14 and irradiate it in the wafer moving in a reciprocating motion, there is a need to perform a highly precise energy analysis, center trajectory correction, and beam focusing/defocusing adjustment in advance.

The beam deflection unit 16 performs the energy analysis, the center trajectory correction, and the energy dispersion control on the high energy ion beam. The beam deflection unit 16 includes at least two highly precise deflection electromagnets, at least one energy spread confining slit, an energy analysis slit, and at least one horizontal focusing unit. The plurality of deflection electromagnets are arranged so as to perform the energy analysis of the high energy ion beam, to correct the ion implantation angle precisely, and to suppress the energy dispersion.

The beam deflection unit 16 includes an energy analysis electromagnet 24, a horizontal focusing quadrupole lens 26 that suppresses energy dispersion, an energy analysis slit 28, and a steering electromagnet 30 providing steering (trajectory correction). The energy analysis electromagnet 24 is one at the most upstream side out of the plurality of deflection electromagnets in the beam deflection unit 16. The steering electromagnet 30 is one at the most downstream side out of the plurality of deflection electromagnets in the beam deflection unit 16. Meanwhile, the energy analysis electromagnet 24 may be called an energy filter electromagnet (EFM). The direction of the high energy ion beam is changed by the beam deflection unit 16 so as for the beam to be directed toward the wafer 40.

The ions that pass through the deflection electromagnets of the beam deflection unit 16 are subjected to a centrifugal force and a Lorentz force, and hence draws a circular-arc trajectory by balance of these forces. This balance is represented by a relation of mv=qBr. Here, m indicates the mass of the ion, v indicates the velocity of the ion, q indicates the valence number of the ion, B indicates the magnetic flux density of the deflection electromagnet, and r indicates the curvature radius of the trajectory. Only the ions in which the curvature radius r of the trajectory matches the curvature radius of the magnetic center of the deflection electromagnet may pass through the deflection electromagnet. In other words, in a case in which the ions have the same valence number, the ions that may pass through the deflection electromagnet applied with the uniform magnetic field B are only the ions having the specific momentum mv. The EFM is called the energy analysis electromagnet, but is actually a device that is used to analyze the momentum of the ion. A bending magnet (BM) or a mass analysis electromagnet of an ion generation unit is a momentum filter.

Further, the beam deflection unit 16 may deflect the ion beam by 180° just by using a plurality of magnets. Accordingly, the high energy ion implanter in which the beamline has a U shape may be achieved with a simple configuration.

As described above, the beam deflection unit 16 performs the deflection of the ion beam by 180° by using a plurality of electromagnets between the high energy multistage linear acceleration unit 14 and the beam transportation line unit 18 in the ion implanter that accelerates the ions generated from the ion source and transports the ions to the wafer so as to implant the ions thereto. The energy analysis electromagnet 24 and the steering electromagnet 30 are respectively formed so as to have deflection angles of 90°. As a result, the total deflection angle becomes 180°. Furthermore, the amount of the deflection performed by each magnet is not limited to 90°, and the following combination may be available.

(1) One magnet having deflection amount of 90° and two magnets having deflection amounts of 45°
(2) Three magnets having deflection amounts of 60°
(3) Four magnets having deflection amounts of 45°
(4) Six magnets having deflection amounts of 30°
(5) One magnet having deflection amount of 60° and one magnet having deflection amount of 120°
(6) One magnet having deflection amount of 30° and one magnet having deflection amount of 150°

Since the energy analysis electromagnet 24 needs high magnetic field precision, a highly precise magnetic field measurement device 86 for precisely measuring the magnetic field is provided. The measurement device 86 is appropriate combination of an NMR (nuclear magnetic resonance) probe, which may be referred to as an MRP (magnetic resonance probe), and a Hall probe. The MRP is used to calibrate the Hall probe, and the Hall probe is used in a feedback control for a constant magnetic field. Further, the energy analysis electromagnet 24 is produced with strict precision so that the magnetic field uniformity becomes less than 0.01%. Similarly, the steering electromagnet 30 is provided with a magnetic field measurement device 86. The magnetic field measurement device 86 of the steering electromagnet 30 may be provided with a Hall probe only. Further, each of the energy analysis electromagnet 24 and the steering electromagnet 30 is connected with a power supply and its control device that provide current setting precision and current stability of $1 \times 10^{-4}$ or less.

The beam transportation line unit 18 is used to transport the ion beam B exiting from the beam deflection unit 16, and includes a beam focusing/defocusing device 32 formed by a focusing/defocusing lens group, a beam scanner 34, a beam collimator 36, and an electrostatic final energy filter 38 (with a final energy separation slit). The length of the beam transportation line unit 18 is designed so as to match the total length of the ion beam generation unit 12 and the high energy multistage linear acceleration unit 14. The beam transportation line unit 18 is connected to the high energy multistage linear acceleration unit 14 via the beam deflection unit 16 so as to form a U-shaped layout as a whole.

Figure 2A:
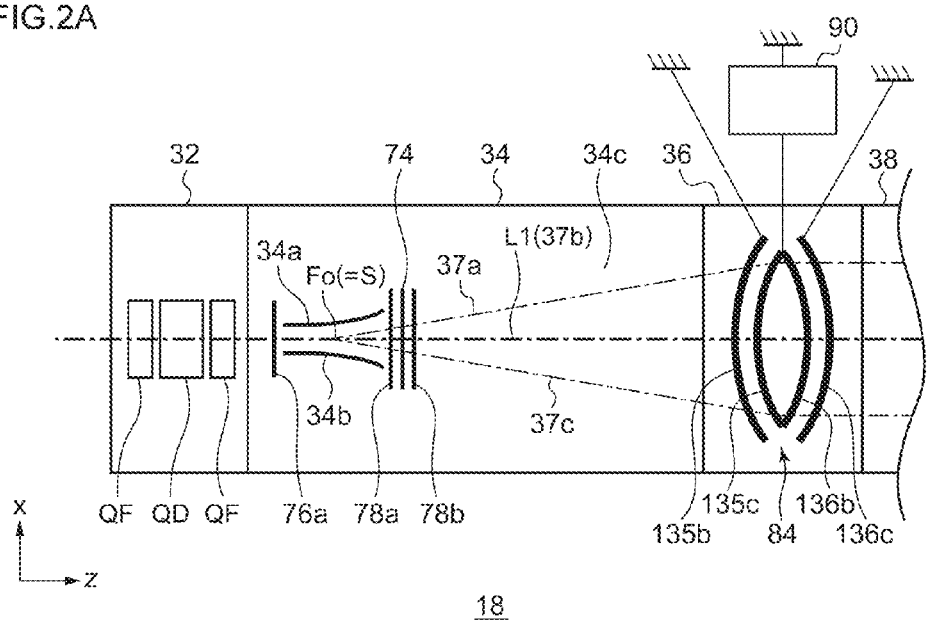
FIG. 2A is a plan view illustrating a partial schematic configuration of a beam transportation line unit illustrated in FIG. 1.

FIG. 2A is a plan view illustrating a partial schematic configuration of the beam transportation line unit 18. Ions which has desired mass and desired energy separated by the beam deflection unit 16 and other devices which are disposed upstream side of the beam deflection unit is focused/defocused in a desired cross-sectional shape by the beam focusing/defocusing device 32. As illustrated in the figure, the beam focusing/defocusing device 32 is configured as (an electric field type or a magnetic field type) focusing/defocusing lens group such as a Q (quadrupole) lens. The beam having a focused/defocused cross-sectional shape is scanned in a direction parallel to the surface of FIG. 2A by the beam scanner 34. For example, the beam focusing/defocusing device is configured as a triplet Q lens group including a horizontal focusing (vertical defocusing) lens QF/a horizontal defocusing (a vertical focusing) lens QD/a horizontal focusing (a vertical defocusing) lens QF. If necessary, the beam focusing/defocusing device 32 may be configured by each of the horizontal focusing lens QF and the horizontal defocusing lens QD or the combination thereof.

Figure 2B:
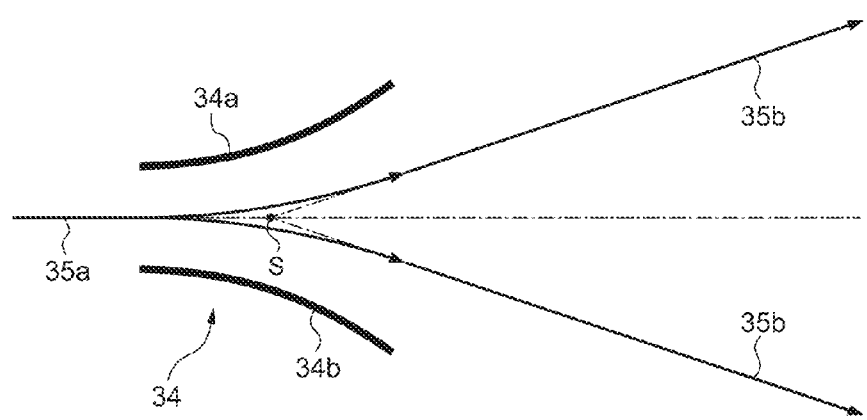
FIG. 2B is a schematic view illustrating a scan origin of a beam scanner.

The beam scanner 34 is configured to scan the ion beam by deflecting the ion beam in the x direction at a scan origin S at a periodically changing deflection angle. As illustrated in FIG. 2B, the scan origin S is an intersection point of an extension of an entrance beam trajectory 35a to the beam scanner 34 and an extension of an exit beam trajectory 35b from the beam scanner 34.

The beam scanner 34 is a deflection scan device that causes the ion beam to be periodically scanned in the horizontal direction perpendicular to the ion beam traveling direction in a reciprocating manner by the periodically changing electric field. As illustrated in FIG. 2A, the beam scanner 34 includes a pair of (two) scan electrodes 34a and 34b (bipolar deflection scan electrodes) that are disposed so as to face each other with the ion beam passage region interposed therebetween in the beam traveling direction. Then, a scan voltage that changes to positive and negative values at a predetermined frequency in the range of 0.5 Hz to 4000 Hz and is approximated to the triangular wave is applied to the two scan electrodes 34a and 34b with polarity of the voltage being opposite each other. The scan voltage generates a changing electric field that deflects the beam passing through the gap between the two scan electrodes 34a and 34b. Then, the beam that passes through the gap is scanned in the horizontal direction by the periodic change of the scan voltage.

A suppression electrode 74 that has an opening in the ion beam passage region is disposed between two ground electrodes 78a and 78b at the downstream side of the beam scanner 34. A ground electrode 76a is disposed before the scan electrodes at the upstream side thereof, but if necessary, a suppression electrode having the same configuration as that of the downstream side may be disposed. The suppression electrode suppresses the intrusion of electrons to the positive electrode.

A beam scan space portion 34c is provided in a long section at the downstream side of the beam scanner 34 inside a scan housing, and hence a sufficient scan width at the entrance of the beam collimator 36 may be obtained even when the beam scan angle is narrow. At the rear side of the scan housing located at the downstream side of the beam scan space portion 34c, the beam collimator 36 is installed such that the scanned ion beam is deflected to be directed to the direction of the ion beam before the beam is scanned. That is, the beam collimator 36 bends the beam again so as to be parallel to the beamline L1.

Since the aberration (a difference in focal distance between the center portion of the beam collimator and right/left end) generated in the beam collimator 36 is proportional to the square of the deflection angle of the beam scanner 34, the aberration of the beam collimator 36 may be largely suppressed when the beam scan space portion 34c is increased in length and the deflection angle is decreased. If the aberration is large, the center portion and the right/left end of the semiconductor wafer have different beam sizes and beam divergence angles when the ion beam is implanted into the semiconductor wafer, and hence the quality of the product becomes non-uniform.

Further, when the length of the beam scan space portion 34c is adjusted, the length of the beam transportation line unit may match the length of the high energy multistage linear acceleration unit 14.

The beam collimator 36 is configured to collimate the ion beam incident from the beam scanner 34 and a beam passage region extends along the x direction (the horizontal direction) at the downstream of the beam collimator 36. The beam collimator 36 is an electrostatic beam collimator, for example.

The beam collimator 36 is provided with an electric field collimating lens 84. As illustrated in FIG. 2A, the collimating lens 84 includes a plurality of pairs of acceleration electrodes and a plurality of pairs of deceleration electrodes substantially having a hyperbolic shape. The electrodes of each pair face each other across an acceleration or deceleration gap interposed therebetween and having a width not causing a discharge. An electric field generated in an acceleration or deceleration gap has a longitudinal element along the reference trajectory and a horizontal element perpendicular to the reference trajectory on the xz plane. The horizontal element perpendicular to the reference trajectory is strengthened in proportional to a distance from the reference trajectory in the x direction. The ion beam is focused in the horizontal direction by the electric field.

The downstream electrode in the pair of electrodes with the acceleration gap interposed therebetween and the upstream electrode of the deceleration gap are formed as an integrated structure, and the downstream electrode of the deceleration gap and the upstream electrode of the next acceleration gap are formed as an integrated structure, so as to have the same potential.

From the upstream side of the electric field collimating lens 84, the first electrode (the entrance electrode) and the final electrode (the exit electrode) are maintained at the ground potential. Accordingly, the energy of the beam at the positions before and behind the collimating lens 84 does not change.

In the intermediate electrode structure, the exit electrode of the acceleration gap and the entrance electrode of the deceleration gap are connected with a negative power supply 90 having a variable constant voltage, and the exit electrode of the deceleration gap and the entrance electrode of the acceleration gap are connected with a positive power supply having a variable constant voltage (in a case of n stages, negative, positive, negative, positive, negative, and the like). Accordingly, the ion beam is gradually directed toward the direction parallel to the reference trajectory of the beamline while being accelerated and decelerated repeatedly. Finally, the ion beam reaches the trajectory parallel to the ion beam traveling direction (the beamline trajectory direction) before the deflection scanning operation.

As illustrated in FIG. 2A, the beam collimator 36 has a focus $F_0$ on the reference trajectory (e.g., the beamline L1 illustrated in FIG. 2A). A plurality of beam trajectories 37a, 37b, and 37c incident to the beam collimator 36 respectively have different angles from the reference trajectory. The beam collimator 36 is designed to deflect each of the plurality of beam trajectories 37a, 37b, and 37c at a different deflection angle in accordance with the incident angle so that the plurality of beam trajectories 37a, 37b, and 37c is parallel to the reference trajectory. The beam collimator 36 is operated when it receives electric input (e.g., voltage) predetermined in accordance with predetermined conditions of ion implantation (e.g., conditions including target beam energy).

The plurality of beam trajectories 37a, 37b, and 37c are on a plane containing the reference trajectory, on which the beam trajectories 37a, 37b, and 37c are respectively directed from the focus $F_0$ to the beam collimator 36 at different incident angles. Since the plurality of beam trajectories 37a, 37b, and 37c are results of scanning by the beam scanner 34 in the present embodiment, this plane is equivalent to a scan plane (an xz plane) of the beam scanner 34. Any of the beam trajectories (the beam trajectory 37b in FIG. 2A) may correspond to the reference trajectory. In the present embodiment illustrated in FIG. 2A, the reference trajectory is not deflected in the beam collimator 36 but goes straight in the beam collimator 36.

The ion implanter 100 according to the present embodiment is configured so that the focus $F_0$ of the beam collimator 36 corresponds to the scan origin S of the beam scanner 34. Accordingly, the beam that is scanned by the beam scanner 34 at the scan origin S converges by the beam collimator 36 including the electric field collimating lens and the like and becomes parallel to the axis (the reference axis) of the deflection angle 0° parallel to the ion beam traveling direction (the beamline trajectory direction) before the scan operation. At this time, the scan region is formed so as to be bilaterally symmetrical to each other with respect to the reference axis.

In this manner, the beam transportation line unit 18 scans and collimates the high energy ion beam. The collimated ion beam is supplied via the final energy filter 38 to the substrate processing/supplying unit 20. The wafer 40 moving in a reciprocating motion in a direction perpendicular to the beam scan direction and intersecting with the beam traveling direction is irradiated with the collimated ion beam with high precision, and the ions are implanted to the wafer 40.

As illustrated in FIG. 1, the substrate processing/supplying unit 20 is provided at the termination end of the downstream side of the beam transportation line unit 18, and the implantation processing chamber accommodates a beam monitor 102 that measures the beam current, the position, the implantation angle, the convergence and divergence angle, the vertical and horizontal ion distribution, and the like of the ion beam B, a charge prevention device that prevents the charge of the wafer 40 by the ion beam B, a wafer transportation mechanism that carries the wafer 40 and installs the wafer 40 at an appropriate position and an appropriate angle, an ESC (Electro Static Chuck) that holds the wafer 40 during the ion implantation, and a wafer scan mechanism that moves the wafer 40 in a direction perpendicular to the beam scan direction at the velocity in response to a change in the implantation beam current. The substrate processing/supplying unit 20 is configured to provide mechanical scan of the wafer 40.

The beam monitor 102 is configured to measure an x-direction implantation angle of the ion beam. B to the workpiece. The beam monitor 102 is a high-precision angle monitor that measures a beam angle with a measurement error of 0.1° or less, for example. The beam monitor 102 is also configured to measure an x-direction implantation position of the ion beam B in the workpiece. Thus, the beam monitor 102 is a position monitor of the ion beam as well. The beam monitor 102 measures the ion beam B at a position of the workpiece or a measurement position close to the position in advance and, during the implantation process, the beam monitor 102 retreats from the measurement position to stop measurement or monitors the beam at a position close to the measurement position.

The beam monitor 102 may include a slit having a known position and a beam detector arranged at the downstream of the slit. The beam detector has beam detection elements arranged one-dimensionally or two-dimensionally, for example. A traveling direction of the ion beam B can be acquired from a relative position of a beam detecting point detected by the beam detector with respect to the slit. The beam monitor 102 may be movable in a plane perpendicular to the reference trajectory (e.g., in the beam scan direction) and may measure the beam angle at an arbitrary position in the plane.

It is to be noted that the beam monitor 102 may be arranged between the beam collimator 36 and the workpiece to measure the ion beam B at the upstream of the workpiece. Alternatively, the beam monitor 102 may be arranged at the back of the workpiece to measure the ion beam B at the downstream of the workpiece.

Also, the ion implanter 100 includes a control unit 104 configured to control an entirety or a part of the ion implanter 100 (e.g., an entirety or a part of the beamline unit). The control unit 104 is configured to correct a deflection magnetic field in the steering electromagnet 30 based on a measurement result of the beam monitor 102.

Thus, the beamline unit of the ion implanter 100 is configured as a horizontal U-shaped folded beamline having two elongated straight portions facing each other. The upstream elongated straight portion is formed by a plurality of units for accelerating the ion beam B generated by the ion source 10. The downstream elongated straight portion is formed by a plurality of units for adjusting the ion beam B whose direction has been changed against that of the upstream elongated straight portion and implanting the ion beam B into the wafer 40. The two elongated straight portions are formed to have substantially equal lengths. A sufficiently wide work space R1 is provided between the two elongated straight portions for the maintenance work.

In this manner, the high energy ion implanter that is formed by arranging the units in a U shape ensures satisfactory workability while suppressing an increase in foot print. Further, in the high energy ion implanter, the units or the devices are formed as modules, and hence may be attached, detached, and assembled in accordance with the beamline reference position.

Since the high energy multistage acceleration unit 14 and the beam transportation line unit 18 are arranged in a folded-back layout, the overall length of the high energy ion implanter 100 is minimized. In the related-art devices, the units are arranged substantially in a linear layout. The radius of curvature of the plurality of deflecting electromagnets forming the beam deflection unit 16 is optimally configured to minimize the width of the implanter. These measures minimize the footprint of the implanter and makes it possible to do a maintenance work on the components of the high energy multistage linear accelerator unit 14 and the beam transportation line unit 18 in the work space R1 sandwiched by the high energy multistage linear acceleration unit 14 and the beam transportation line unit 18. Because the ion source 10, which is characterized by relatively short maintenance intervals, and the substrate processing and supplying unit 20, in which a substrate needs to be supplied/retrieved, are arranged adjacent to each other, an operator does not need to move a lot.

The ion implanter 100 has an appropriate size due to such a U-shaped beamline layout. However, the U-shaped layout does not shorten the entire length of the beamline from the ion source 10 to the substrate processing/supplying unit 20. The entire length of the beampath is rather longer than that of the linear layout since a length required for the U-shaped deflection and a length required to match the length of the rear-stage beam transportation line unit 18 with the length of the high energy multistage linear acceleration unit 14 are added.

In a long beamline, accumulation of installation errors of respective units enlarges deviation of the position and the incident angle of the beam at the termination end from the designed values. For example, in a case in which an installation position of a focusing quadrupole lens (e.g., the horizontal focusing quadrupole lens 26) deviates laterally, the beam flying on the reference trajectory is incident to the quadrupole lens at a position deviated from the lens center, and thus the trajectory thereof is bent inward (in a direction in which the quadrupole lens deviates) due to a focusing effect. Even when the deviation of the trajectory is small in each device, the angular and positional deviation from the reference trajectory is enlarged as the beam passes through multiple devices and flies for a long distance. Although it is important to install the beamline devices with high precision in order to suppress the deviation of the trajectory from the center, it has limitations.

An embodiment of the present invention has an object to solve such problems. More specifically, an object of an embodiment of the present invention is to provide a high energy ion implanter, including a U-shaped long beamline in which multiple focusing elements are inserted, enabling to eliminate a beam deflection effect caused by installation errors of these focusing elements and to perform ion implantation with high angle precision having a final implantation angle error of ±0.1° or less.

In a high energy ion implanter according to an embodiment, an elongated straight portion that is formed by a plurality of units for accelerating an ion beam generated by the ion source 10 and an elongated straight portion that is formed by a plurality of units for adjusting and implanting a scanned beam into the wafer 40 are arranged in parallel to configure a horizontal U-shaped folded beamline. A U-shaped deflection unit includes a plurality of deflection electromagnets.

At least one deflection electromagnet at the downstream side out of the plurality of deflection electromagnets is used as a deflection electromagnet for precise adjustment of an ion implantation angle in the horizontal direction (in the scan plane). An output value (e.g., coil current value) of the deflection electromagnet is set based on a position and an incident angle (implantation angle) of the beam in the horizontal direction measured directly before the wafer 40 so that the corrected trajectory passes through a scan origin of the beam scanner 34 (a position of the trajectory in the vertical direction does not matter). In this manner, a deflection angle in the deflection electromagnet is corrected so that an implantation angle error to the wafer 40 is ±0.1° or less.

Figure 3:
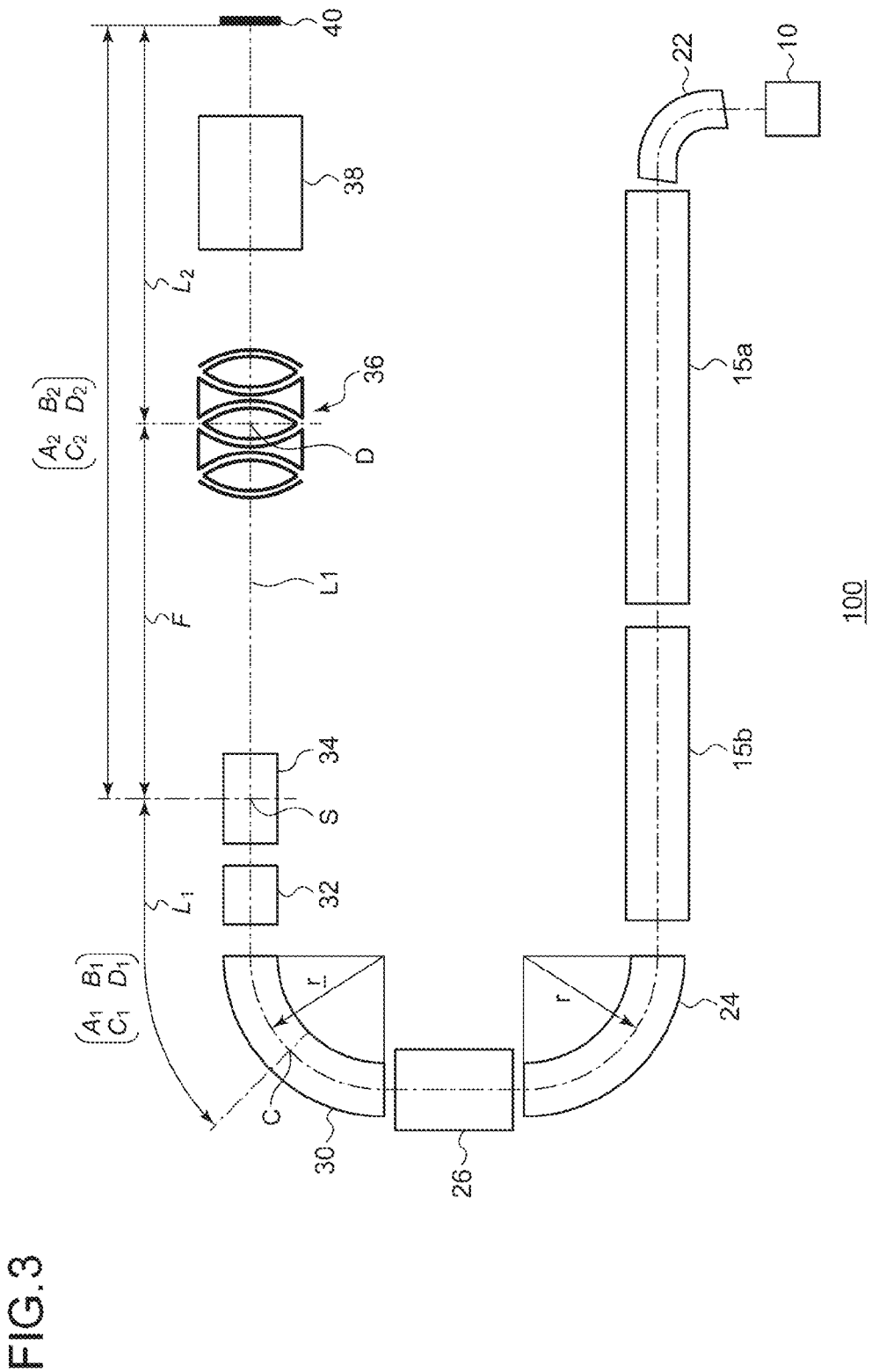
FIG. 3 describes implantation angle correction in a horizontal direction with use of the beam scanner and a steering electromagnet disposed at the upstream of the beam scanner according to an embodiment of the present invention.

Implantation angle correction in the horizontal direction with use of the beam scanner 34 and the steering electromagnet 30 disposed at the upstream of the beam scanner 34 will be described in detail below with reference to FIG. 3. The steering electromagnet 30 performs 90° deflection and center trajectory correction (steering function) at the same time.

A deviation of the actual beam trajectory with respect to the reference trajectory in the horizontal direction at a center C of the steering electromagnet 30 is expressed as Xs, and an inclination thereof is expressed as Xs'. The inclination Xs' is an angle defined between the actual beam trajectory and the reference trajectory on the xz plane. That is, the actual beam trajectory has an x-direction trajectory error with the position error Xs and the angle error Xs' at the center C of the steering electromagnet 30 resulting from installation errors of the devices. Such a trajectory error may occur in a case in which focusing elements such as an electrostatic Q lens, a Q electromagnet (a quadrupole electromagnet), and a surface angle of a deflection electromagnet are inserted in the beam deflection unit 16.

An x-direction trajectory error at the wafer position, that is, an implantation position error Xw and an implantation angle error Xw' can be related to the x-direction trajectory error in the steering electromagnet 30 as in Equation (1) shown below with use of a beam transfer matrix.

$$\begin{pmatrix} X_W \\ X'_W \end{pmatrix} = \begin{pmatrix} A_2 & B_2 \\ C_2 & D_2 \end{pmatrix} \begin{pmatrix} A_1 & B_1 \\ C_1 & D_1 \end{pmatrix} \begin{pmatrix} X_S \\ X'_S \end{pmatrix} \quad (1)$$

In this equation, $$\begin{pmatrix} A_1 & B_1 \\ C_1 & D_1 \end{pmatrix}$$

is an x-direction beam transfer matrix from the steering electromagnet 30 to the beam scanner 34. This may be referred to as "a first beam transfer matrix" below. Also, $$\begin{pmatrix} A_2 & B_2 \\ C_2 & D_2 \end{pmatrix}$$

is an x-direction beam transfer matrix from the beam scanner 34 to the wafer 40. This may be referred to as "a second beam transfer matrix" below.

The beam transfer matrix is a solution of a motion equation, representing motion of the ions in the various devices constituting the beamline, expressed in the form of a matrix. By multiplying all of the beam transportation matrices corresponding to the devices in a certain section of the beamline, a solution of the motion equation in the section can be obtained.

The implantation position error Xw and the implantation angle error Xw' are obtained as a position and an angle of the beam on the wafer 40 measured by the beam monitor 102. Equation (1) is calculated backward from these measurement values. The position error Xs and the angle error Xs' at the center C of the steering electromagnet 30 corresponding to the measurement position and the measurement angle of the beam on the wafer 40 are then derived. To calculate Equation (1) backward, each inverse matrix has only to be multiplied by Equation (1) from the left. Considering the fact that the determinant for a beam transfer matrix is always 1, Equation (2) shown below is obtained from Equation (1).

$$\begin{pmatrix} X_S \\ X'_S \end{pmatrix} = \begin{pmatrix} D_1 & -B_1 \\ -C_1 & A_1 \end{pmatrix} \begin{pmatrix} D_2 & -B_2 \\ -C_2 & A_2 \end{pmatrix} \begin{pmatrix} X_W \\ X'_W \end{pmatrix} = \quad (2)$$

$$\begin{pmatrix} D_1 D_2 + B_1 C_2 & -D_1 B_2 - B_1 A_2 \\ -C_1 D_2 - A_1 C_2 & C_1 B_2 + A_1 A_2 \end{pmatrix} \begin{pmatrix} X_W \\ X'_W \end{pmatrix}$$

Through this calculation, the x-direction trajectory error values Xs and Xs' at the correction point are derived from the measurement values Xw and Xw' of the x-direction trajectory error at the implantation point.

A correction amount of the deflection angle in the steering electromagnet 30 is calculated by using these values. A deflection correction angle Δs is added to 90° as the preset deflection angle of the steering electromagnet 30. When the correction angle Δs is added to the actual beam trajectory in the steering electromagnet 30, the inclination of the actual trajectory against the reference trajectory is changed from Xs' to (Xs'+Δs).

Suppose the actual trajectory intersects with the reference trajectory at an angle Xsc' at the scan origin S as a result of this angle correction. In this case, the position and the angle of the actual trajectory in the x direction at the scan origin S are related to the corrected x-direction trajectory error at the steering electromagnet 30 as Equation (3) shown below with use of the first beam transfer matrix. Here, the position of the actual trajectory in the x direction at the scan origin S is zero since the actual trajectory intersects with the reference trajectory.

$$\begin{pmatrix} 0 \\ X'_{sc} \end{pmatrix} = \begin{pmatrix} A_1 & B_1 \\ C_1 & D_1 \end{pmatrix} \begin{pmatrix} X_S \\ X'_S + \Delta_S \end{pmatrix} \quad (3)$$

Accordingly, the x-direction correction angle Δs at the steering electromagnet 30 to cause the actual beam trajectory to intersect with the reference trajectory at the scan origin S is derived from the first row of Equation (3) and Equation (2), as expressed in Equation (4) shown below.

$$\Delta_S = -X'_S - \frac{A_1}{B_1} X_S = -\frac{D_2}{B_1} X_W - \frac{B_2}{B_1} X'_W \quad (4)$$

Next, description in which the x-direction implantation angle error on the wafer 40 is zero when the actual trajectory intersects with the reference trajectory at the scan origin S will be provided. This is theoretically proved by specific consideration of the second beam transfer matrix.

The second beam transfer matrix is expressed as a product of the following three transportation matrices, that is, a transfer matrix from the beam scanner 34 to the beam collimator 36, a transfer matrix of the beam collimator 36, and a transfer matrix from the beam collimator 36 to the wafer 40. When a distance from the scan origin S to a center D of the collimating lens 84 is F, the transfer matrix from the beam scanner 34 to the beam collimator 36 is $$\begin{pmatrix} 1 & F \\ 0 & 1 \end{pmatrix}.$$

The collimating lens 84 is a lens having a focal distance of this distance F as described above and thus collimates all trajectories passing through the scan origin S with the reference trajectory. The transfer matrix of the collimating lens 84 is $$\begin{pmatrix} 1 & 0 \\ -1/F & 1 \end{pmatrix}.$$

Since the final energy filter 38 deflects the trajectory in the y direction, the final energy filter 38 does not influence on the trajectory in the x direction. Thus, when a distance from the center D of the collimating lens 84 to the wafer 40 is $L_2$, the transfer matrix in the horizontal plane in this section is $$\begin{pmatrix} 1 & L_2 \\ 0 & 1 \end{pmatrix}.$$

Accordingly, the second beam transfer matrix is expressed as Equation (5) shown below.

$$\begin{pmatrix} A_2 & B_2 \\ C_2 & D_2 \end{pmatrix} = \begin{pmatrix} 1 & L_2 \\ 0 & 1 \end{pmatrix} \begin{pmatrix} 1 & 0 \\ -1/F & 1 \end{pmatrix} \begin{pmatrix} 1 & F \\ 0 & 1 \end{pmatrix} = \begin{pmatrix} 1 - L_2/F & F \\ -1/F & 0 \end{pmatrix} \quad (5)$$

Suppose the actual beam trajectory corrected by steering with the correction angle Δs given in Equation (3) and Equation (4) has an implantation position error $Xw_2$ and an implantation angle error $Xw_2'$ on the wafer 40. At this time, since the actual beam trajectory intersects with the reference trajectory at the angle Xsc' at the scan origin S as a result of the steering with the correction angle Δs, the implantation position error $Xw_2$ and the implantation angle error $Xw_2'$ are calculated by Equation (6) shown below with use of the second beam transfer matrix in Equation (5).

$$\begin{pmatrix} X_{W2} \\ X'_{W2} \end{pmatrix} = \begin{pmatrix} 1 - L_2/F & F \\ -1/F & 0 \end{pmatrix} \begin{pmatrix} 0 \\ X'_{SC} \end{pmatrix} = \begin{pmatrix} FX'_{SC} \\ 0 \end{pmatrix} \quad (6)$$

From the second row of Equation (6), the implantation angle error $Xw_2'$ is zero. This means the implantation angle error disappears when the deflection angle in the steering electromagnet 30 is corrected so that the actual beam trajectory passes through the scan origin S.

From Equation (5), $B_2=F$, and $D_2=0$ in the second beam transfer matrix. Thus, Equation (4), which gives the correction angle Δs, is simplified as Equation (7) shown below.

$$\Delta_S = -\frac{F}{B_1} X'_W \quad (7)$$

Furthermore, in a case in which there is no other beamline component in the section from the steering electromagnet 30 to the beam scanner 34, and in which a distance in the section is $L_1$, $B_1=L_1$. Thus, Equation (7) becomes Equation (8) shown below.

$$\Delta_S = -\frac{F}{L_1} X'_W \quad (8)$$

Equation (8) provides an indication for the correction angle Δs. In Equation (8), the correction angle Δs is a product of the non-corrected implantation angle error Xw' measured at the wafer position and a constant $(-F/L_1)$. This constant represents a ratio of the distance F from the beam scanner 34 to the beam collimator 36 to the distance $L_1$ from the steering electromagnet 30 to the beam scanner 34.

Figure 4A:
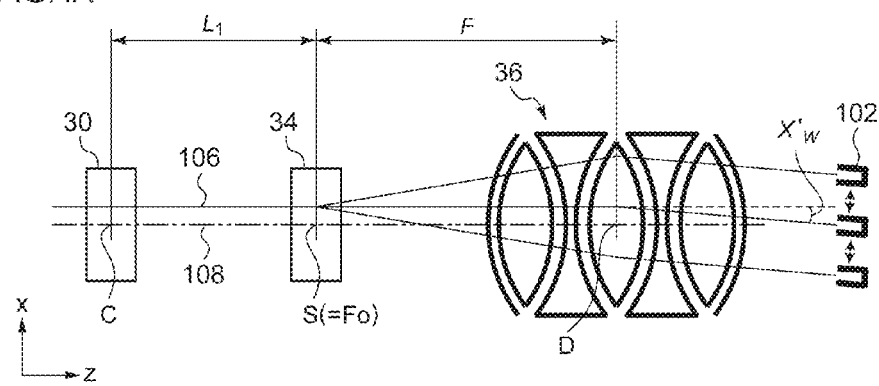
FIGS. 4A and 4B are schematic views illustrating implantation angle correction by the steering electromagnet according to an embodiment of the present invention.
Figure 4B:
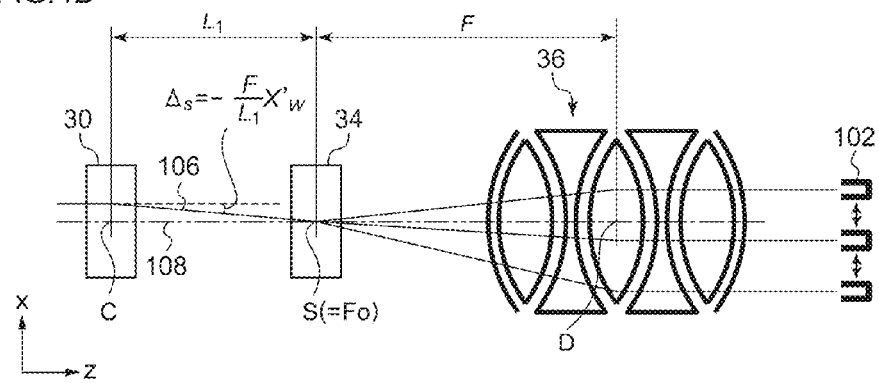
Figure 4C:
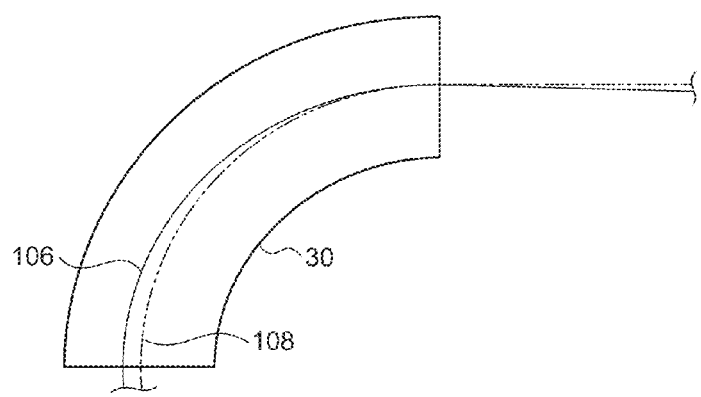
FIG. 4C is a schematic view illustrating a beam trajectory in the steering electromagnet.
Figure 5:
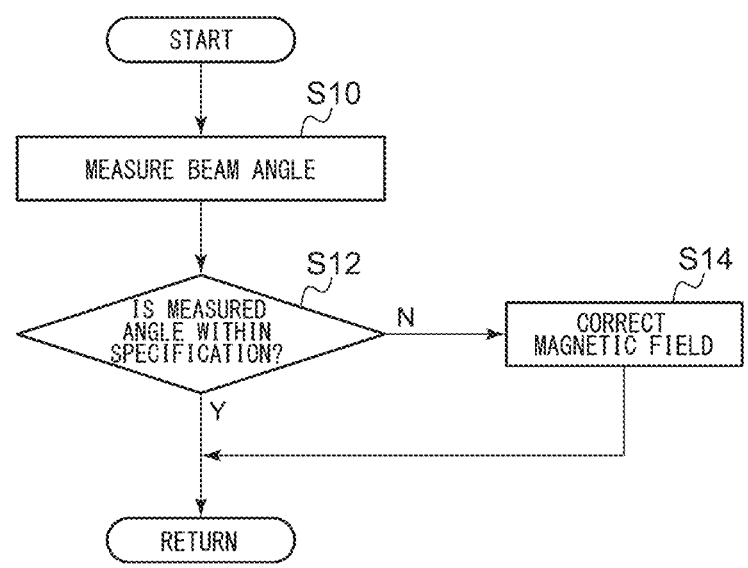
FIG. 5 is a flowchart illustrating a method for correcting an implantation angle according to an embodiment of the present invention.

FIGS. 4A and 4B are schematic views illustrating implantation angle correction by the steering electromagnet 30 using Equation (8). FIG. 4A illustrates a non-corrected state while FIG. 4B illustrates a corrected state. FIG. 4C is a schematic view illustrating the beam trajectory in the steering electromagnet 30. FIG. 5 is a flowchart illustrating a method for correcting an implantation angle according to an embodiment of the present invention.

As illustrated in FIG. 4A, in a case in which an actual beam trajectory 106 deviates from a reference trajectory 108 in the x direction in the steering electromagnet 30, which causes the actual beam trajectory 106 to deviate from the scan origin S in the x direction, an ion beam 110 collimated by the beam collimator 36 has the implantation angle error Xw'.

In the method for correcting an implantation angle illustrated in FIG. 5, the implantation angle error Xw' is measured at the wafer position by the beam monitor 102 (S10). The control unit 104 determines whether or not the measured implantation angle error Xw' is within a specification (S12). For example, the control unit 104 determines whether or not the measured implantation angle error Xw' is within a predetermined allowable range. In a case in which the measured implantation angle error Xw' is determined to be within the specification (Y in S12), no implantation angle correction is required. In this case, the control unit 104 periodically repeats measurement of the implantation angle error Xw'.

In a case in which the measured implantation angle error Xw' is determined to be out of the specification (N in S12), the control unit 104 corrects the magnetic field of the steering electromagnet 30 (S14). The control unit 104 controls the steering electromagnet 30 so that the correction angle Δs corresponding to the measured implantation angle error Xw' is added to the deflection angle of the steering electromagnet 30.

In this case, the corrected implantation angle error $Xw_2'$ is measured (S10), and the control unit 104 determines again whether or not the measured implantation angle error $Xw_2'$ is within the specification (S12). In a case in which the measured implantation angle error $Xw_2'$ is determined to be within the specification (Y in S12), no further correction is performed. Normally, the implantation angle error $Xw_2'$ falls within the specification as a result of a single correction. However, in a case in which the measured implantation angle error $Xw_2'$ is determined to be out of the specification (N in S12), the deflection angle in the steering electromagnet 30 is corrected again (S14). Thereafter, similar processing is repeated.

As illustrated in FIG. 4B, the correction angle Δs is given in the steering electromagnet 30 to cause the actual beam trajectory 106 to intersect with the reference trajectory 108 at the scan origin S. As described above, the beam trajectory passing through the scan origin S is collimated by the beam collimator 36 and the beam traveling direction is the same as the reference trajectory 108. Thus, the ion beam 110 collimated by the beam collimator 36 has no implantation angle error.

In this manner, the implantation angle to the wafer is measured when the actual beam trajectory deviates from the scan origin S, and a correction amount in a beam deflector is determined to offset the implantation angle error. The method for correcting an implantation angle according to the present embodiment may be performed at a preparation stage for ion implantation or may be performed periodically during ion implantation.

Preferably, the beam scanner 34 may be configured to deflect the actual beam trajectory at a deflection angle equivalent to the intersection angle Xsc' between the actual beam trajectory and the reference trajectory. This can null the implantation position error $Xw_2$ as well as the implantation angle error $Xw_2'$ as is described below.

From the first row of Equation (6), $Xw_2=FXsc'$. The implantation position error $Xw_2$ is proportional to the intersection angle Xsc' between the actual beam trajectory and the reference trajectory in the beam scanner 34. This intersection angle Xsc' is equivalent to an angle between the actual trajectory and the reference trajectory at the exit of the beam scanner 34 when the actual trajectory is linear without being deflected in the beam scanner 34 (that is, when scan voltage between the scan electrodes 34a and 34b is zero). Accordingly, by adding a direct-current component to the scan voltage to compensate the intersection angle Xsc' (by adding so-to-speak offset voltage to the scan voltage), the implantation position error $Xw_2$ can be zero. The offset voltage is set to give the ion beam a deflection angle of $-Xsc'$ $(=-Xw_2/F)$ between the scan electrodes 34a and 34b of the beam scanner 34.

Meanwhile, in the above description of the implantation angle correction, the beam transfer matrix is simplified to facilitate understanding. For example, the beam focusing/defocusing device 32 exists between the steering electromagnet 30 and the beam scanner 34 in actual cases, but this is not considered in the above description. Also, a method called thin-layer approximation or thin lens approximation is used for the transfer matrix herein, but actual calculation of the beam transfer matrix is more complicated.

Also, in FIGS. 4A and 4B, illustration of deflection of the ion beam in the steering electromagnet 30 is omitted. In addition, FIG. 4A is simplified as if the trajectory errors on the entrance side and the exit side of the steering electromagnet 30 were equal, but this does not generally occur. For example, as illustrated in FIG. 4C, deviation of the actual trajectory 106 from the reference trajectory 108 on the entrance side of the steering electromagnet 30 differs from deviation of the actual trajectory 106 from the reference trajectory 108 on the exit side of the steering electromagnet 30.

In an embodiment of the present invention, the beamline unit of the ion implanter 100 includes a beamline upstream part, a beamline middle part disposed at the downstream of the beamline upstream part, and a beamline downstream part disposed at the downstream of the beamline middle part. The beamline upstream part includes the ion beam generation unit 12 that generates the ion beam and the high energy multistage linear acceleration unit 14 that accelerates the ion beam. The beamline middle part includes the beam deflection unit 16, and the beam deflection unit 16 includes the plurality of deflection electromagnets. The plurality of deflection electromagnets include at least one energy analysis electromagnet 24 and at least one steering electromagnet 30 disposed at the downstream of the energy analysis electromagnet 24. The beamline downstream part includes the beam scanner 34 and the beam collimator 36 disposed at the downstream of the beam scanner 34.

The beamline unit of the ion implanter 100 includes a beam deflector configured to enable to deflect the ion beam in the x direction. The beam deflector is at least one steering electromagnet 30 in the beam deflection unit 16, for example. Alternatively, the beam deflector may be a different deflection electromagnet in the beam deflection unit 16 from the steering electromagnet 30. For example, the beam deflector may be a deflection electromagnet disposed at the upstream or downstream of the steering electromagnet 30. Alternatively, the beam deflector may be provided in the beam transportation line unit 18. For example, the beam deflector may be disposed between the beam focusing/defocusing device 32 and the beam scanner 34.

The beam scanner 34 is disposed at the downstream of the beam deflector. The beam scanner 34 has the scan origin S on the reference trajectory and is configured to scan the ion beam at the scan origin S in the x direction. Thus, the x direction is a scan direction of the beam scanner 34. The beam collimator 36 includes the collimating lens 84 configured to collimate the ion beam in the z direction. The focus $F_0$ of the collimating lens 84 substantially corresponds to the scan origin S.

The beam deflector is disposed at the upstream of the beam scanner 34 so that the position error and the angle error in the x direction of the actual beam trajectory against the reference trajectory in the beam scanner 34 are related to the position error and the angle error in the x direction of the actual beam trajectory against the reference trajectory in the beam deflector. Specifically, for example, the x-direction position error and the x-direction angle error in the beam deflector are related to the x-direction position error and the x-direction angle error in the beam scanner 34 with use of the beam transfer matrix.

Also, the beamline unit is configured so that the position error and the angle error in the x direction of the actual beam trajectory against the reference trajectory in the workpiece are related to the position error and the angle error in the x direction of the actual beam trajectory against the reference trajectory in the beam scanner 34. Specifically, for example, the x-direction implantation position error and the x-direction implantation angle error are related to the x-direction position error and the x-direction angle error in the beam scanner 34 with use of the beam transfer matrix.

The control unit 104 corrects the deflection angle in the x direction in the beam deflector so as to generate a desired x-direction angle error (and/or an x-direction position error) of the actual beam trajectory in the beam scanner 34. The desired x-direction angle error (and/or the x-direction position error) in the beam scanner 34 is related to a desired x-direction implantation angle and/or an x-direction implantation position to the workpiece. In this manner, precise adjustment of the ion implantation angle in the x direction can be performed.

For example, the control unit 104 is configured to correct the deflection angle in the x direction in the beam deflector so that the actual beam trajectory intersects with the reference trajectory at the scan origin S on the scan plane. As described above, when the actual beam trajectory intersects with the reference trajectory at the scan origin S, the x-direction implantation angle error to the workpiece can be substantially zero. In a case in which the steering electromagnet 30 is used as the beam deflector, 90° beam deflection in the x-direction and precise x-direction beam angle adjustment are performed at the same time.

The control unit 104 may correct the magnetic field in the steering electromagnet 30 based on the x-direction implantation angle measured by the beam monitor 102 so that the actual beam trajectory intersects with the reference trajectory at the scan origin S, for example. The x-direction implantation angle error is obtained from the measurement value of the x-direction implantation angle. The magnetic field in the steering electromagnet 30 is corrected so as to offset the implantation angle error as a result of intersection of the actual trajectory with the reference trajectory at the scan origin S. In this manner, the implantation angle error can be preferably zero as a result of a single magnetic field correction.

The magnetic field measurement device 86 that measures the magnetic field in the steering electromagnet 30 may be calibrated in a state in which the magnetic field in the steering electromagnet is corrected so that the actual trajectory of the ion beam intersects with the reference trajectory at the scan origin S.

In a case in which the beam deflection unit 16 includes two 90° deflection electromagnets consisting of the energy analysis electromagnet 24 at the upstream side and the steering electromagnet 30 at the downstream side, mass and energy of an ion passing through the energy analysis electromagnet 24 are known. At this time, the following relation is established among an average magnetic field (magnetic flux density) B [T] of the steering electromagnet 30 and energy E [keV] and mass m [amu] of the ion. In this equation, n is a valence number of the ion, and r [m] is a curvature radius of the deflection electromagnet.

$$B = 4.55286 \times 10^{-3} \times \frac{\sqrt{mE}}{nr} \qquad (9)$$

On the other hand, in a case in which a magnetic field measurement value (a read value) of the steering electromagnet 30 when the ion beam implantation angle is set to approximately 0° in the aforementioned procedure is Bm, calibration of the magnetic field measurement value can be performed by multiplying this measurement value by a coefficient B/Bm. Once such calibration is performed at the time of installing the apparatus, high implantation angle precision can be obtained at all times only by adjusting the magnetic field measurement value to a value expressed by Equation (9).

A correction range of the deflection angle in the x direction in the beam deflector is at most 1% or less or 0.5% or less of a designed deflection angle in the beam deflector, for example. In other words, the beam deflector configured to deflect the ion beam at α° in design corrects the ion beam so that the ion beam is deflected at a deflection angle selected within a range of (1±0.01) α° or a range of (1±0.005) α°. In this respect, the beam deflector is configured to deflect the ion beam at approximately α°.

For example, the plurality of deflection electromagnets of the beam deflection unit 16 are configured to deflect the ion beam accelerated by the high energy multistage linear acceleration unit 14 at approximately 180°. Also, the plurality of deflection electromagnets of the beam deflection unit 16 are one energy analysis electromagnet 24 and one steering electromagnet 30, and the energy analysis electromagnet 24 and the steering electromagnet 30 are configured to deflect the ion beam at approximately 90°, respectively.

The steering electromagnet 30 deflects the ion beam B at 90° in the x direction and precisely adjusts the x-direction implantation angle of the ion beam B. A deflection angle correction amount set for this precise adjustment is as large as less than 1% or less than 0.5% of the deflection angle 90° of the steering electromagnet 30, for example. A corrected deflection angle in the steering electromagnet 30 is given as the sum of the specified deflection angle 90° and the correction amount, which is approximately 90°.

In the case in which the beam deflection unit 16 includes two 90° deflection electromagnets consisting of the energy analysis electromagnet 24 at the upstream side and the steering electromagnet 30 at the downstream side, the steering electromagnet 30 is preferably connected with a power supply having setting precision and stability of about $1 \times 10^{-4}$ (=0.05/90×0.20) and a control device thereof. That is, the steering electromagnet 30 may include a power supply unit having magnetic field setting precision and magnetic field stability of $1 \times 10^{-4}$ or less. By doing so, in a case in which a light ion having minimum energy in tool specification can be deflected 90° when the magnetic field is about 20% of the maximum magnetic field, the correction angle Δs can be set with 0.05° precision.

As described above, according to an embodiment of the present invention, the ion implanter 100 is provided with the steering electromagnet 30 as one of the plurality of deflection electromagnets configured to fold the beamline, the beam scanner 34, and the beam monitor 102 as an angle monitor, and the magnetic field of the steering electromagnet 30 is corrected so that the actual beam trajectory passes through the scan origin S. In this manner, the implantation angle error can be cancelled, and high implantation angle precision can be assured. For example, in a beamline having a long beam transportation distance constituted by multiple devices that may be installed with installation errors, the implantation angle error can be suppressed to less than 0.1°. The electrostatic beam scanner 34 and the electrostatic final energy filter 38 having high angle precision can be used effectively.

It is to be noted that, although only the correction in the horizontal direction (in the scan plane) has been described herein, the ion implanter 100 can perform correction in a direction perpendicular to the horizontal direction by a combination of the implantation angle measurement and a mechanical system which finely adjusts a tilt angle of the wafer along with the measurement to enable ion implantation with the error of less than 0.1°.

In an embodiment, the steering electromagnet 30 may include a main coil for trajectory deflection and a sub coil for deflection angle correction. The main coil includes a main coil power supply. The main coil is provided to perform 90° deflection. The sub coil includes a sub coil power supply enabling independent control from the main coil power supply. The coil winding number of the sub coil is smaller than that of the main coil. The control unit 104 may control the sub coil so that the actual trajectory of the ion beam intersects with the reference trajectory at the scan origin S.

In a case in which the magnetic field is precisely controlled with use of the 90° deflection electromagnet as in the above embodiment, it is desirable to provide an electromagnet power supply having high resolution. On the other hand, in a case in which the sub coil (generally referred to as a trim coil as well) whose winding number is smaller than that of the main coil is used and is excited by the separate power supply, the resolution of the main coil power supply does not need to be raised. In this case, the setting precision and the stability of the sub coil power supply (steering power supply) have only to be $1 \times 10^{-2}$ or so.

Although the deflection electromagnet at the downstream side in the beam deflection unit 16 functions as the steering electromagnet 30 in the above embodiment, a single steering electromagnet may be installed at the downstream of the last deflection electromagnet in the beam deflection unit 16 in an embodiment. In this case as well, the power supply precision of the steering electromagnet has only to be $1 \times 10^{-2}$ or so.

Although the present invention has been described taking the ion implanter 100 suitable for use as a high energy ion implanter as an example in the above embodiment, the present invention can be applied to the other ion implanter including a beam deflector, a beam scanner, and a beam collimator. In an embodiment, for example, precise adjustment of the ion implantation angle in the x direction may be performed in an ion implanter 200 not including the high energy multistage linear acceleration unit 14 as illustrated in FIG. 6.

FIG. 6 is a plan view illustrating a schematic configuration of the ion implanter 200 according to an embodiment of the present invention. The ion implanter 200 includes a plurality of beamline components as illustrated in the figure. A beamline upstream part of the ion implanter 200 includes an ion source 201, a mass analyzer 202, a beam dump 203, a resolving aperture 204, and a current suppression mechanism 205 in this order from the upstream side. Between the ion source 201 and the mass analyzer 202, an extraction electrode (not illustrated) configured to extract ions from the ion source 201 is provided. The current suppression mechanism 205 includes a CVA (continuously variable aperture), for example. The CVA is an aperture whose aperture size can be adjusted by a driving mechanism.

A beamline downstream part of the ion implanter 200 includes a first XY focusing lens 206, a second XY focusing lens 208, a beam scanner 209, a Y focusing lens 210, a beam collimator 211, an AD (accel/decel) column 212, and an energy filter 213 in this order from the upstream side. A wafer 214 is provided at a most downstream portion of the beamline downstream part. The beamline components from the ion source 201 to the beam collimator 211 are housed in a terminal 216. It is to be noted that, between the first XY focusing lens 206 and the second XY focusing lens 208 may be provided a beam current measuring instrument (not illustrated) which can be inserted into and retracted from an ion beam path, for example.

The first XY focusing lens 206, the second XY focusing lens 208, and the Y focusing lens 210 constitutes a beam focusing/defocusing device configured to adjust a beam shape (a beam cross-section in an XY plane) in horizontal and vertical directions. In this manner, the beam focusing/defocusing device includes the plurality of lenses disposed along the beamline between the mass analyzer 202 and the beam collimator 211. The beam focusing/defocusing device can transport an ion beam to the downstream appropriately under conditions of a wide range of energy and beam current due to focusing/defocusing effects of these lenses.

The first XY focusing lens 206 is a Q lens, for example, the second XY focusing lens 208 is an X- and Y-directions einzel lens, for example, and the Y focusing lens 210 is a Y-direction einzel lens or a Q lens, for example. The first XY focusing lens 206, the second XY focusing lens 208, and the Y focusing lens 210 may be single lenses, respectively, or may be a lens group. In this manner, the beam focusing/defocusing device is designed to enable appropriate control of the ion beam under conditions from a condition of low energy and high beam current having a high beam potential and causing a problem of self-divergence of the beam to a condition of high energy and low beam current having a low beam potential and causing a problem of beam cross-sectional shape control.

The energy filter 213 is an AEF (angular energy filter) including a deflection electrode or a deflection electromagnet or both thereof.

The ions generated in the ion source 201 are accelerated by an extraction electric field (not illustrated). The accelerated ions are deflected in the mass analyzer 202. In this manner, only ions having predetermined energy and a predetermined mass-to-charge ratio pass through the resolving aperture 204. Subsequently, the ions are guided via the current suppression mechanism (CVA) 205, the first XY focusing lens 206, and the second XY focusing lens 208 to the beam scanner 209.

The beam scanner 209 applying a periodic electric field or magnetic field (or both) scans the ion beam in the horizontal direction (or in the vertical direction or a diagonal direction) in a reciprocating manner. The ion beam is adjusted by the beam scanner 209 so as to be implanted on the wafer 214 uniformly in the lateral direction. An ion beam 215 scanned in the beam scanner 209 is collimated in a traveling direction by the beam collimator 211 which utilizes the electric field or magnetic field (or both). The ion beam 215 is thereafter accelerated or decelerated to have predetermined energy by the AD column 212 by application of the electric field. The ion beam 215, which has exited from the AD column 212, reaches final implantation energy (in a low energy mode, the ion beam is adjusted to have higher energy than implantation energy and is deflected while being decelerated in the energy filter). The energy filter 213 at the downstream of the AD column 212 deflects the ion beam 215 in a direction toward the wafer 214 by application of the electric field or magnetic field (or both) with use of the deflection electrode or the deflection electromagnet. By doing so, contamination components having energy other than targeted energy are eliminated. The ion beam 215 clarified in terms of energy in this manner is implanted to the wafer 214.

Accordingly, the beamline upstream part of the ion implanter 200 includes the ion source 201 and the mass analyzer 202, and the beamline downstream part of the ion implanter 200 includes the beam focusing/defocusing device disposed at the upstream of the beam scanner 209 and adjusting focusing or defocusing of the ion beam, the beam scanner 209, and the beam collimator 211. The beam focusing/defocusing device may be the first XY focusing lens 206.

A beam monitor 217 is provided close to the wafer 214. The beam monitor 217 is disposed at the downstream of the beam collimator 211 to measure the x-direction implantation angle to the wafer 214. The beam monitor 217 is configured in a similar manner to that of the beam monitor 102 described with reference to FIG. 1.

Also, the ion implanter 200 includes a control unit 218 configured to control an entirety or a part of the ion implanter 200 (e.g., an entirety or a part of the beamline unit). The control unit 218 is configured to control a beam deflector based on a measurement result of the beam monitor 217. The beam deflector is provided in the beam focusing/defocusing device. In other words, the beam focusing/defocusing device is configured to provide a so-to-speak steering function.

The beam focusing/defocusing device includes at least one quadrupole lens, and the quadrupole lens includes a pair of electrodes opposed to each other in the x direction and a power supply unit giving different potentials to the respective paired electrodes. The control unit 218 corrects a potential difference between the paired electrodes of the beam focusing/defocusing device based on the x-direction implantation angle measured by the beam monitor 217 so that an actual beam trajectory of the ion beam 215 intersects with a reference trajectory at a scan origin. In this manner, the precise adjustment of the ion implantation angle in the x direction can be performed.

Although the beam deflector constitutes a part of the beam focusing/defocusing device in the ion implanter 200, the beam deflector may be provided separately from the beam focusing/defocusing device in an embodiment. In this case, the beam deflector may be disposed between the mass analyzer and the beam scanner (e.g., between the mass analyzer and the beam focusing/defocusing device, or between the beam focusing/defocusing device and the beam scanner).

The present invention has been described above based on the embodiments. It is to be understood by those skilled in the art that the present invention is not limited to the above embodiments but can be changed in design and can be modified in various forms and that such modifications are included in the scope of the present invention.

It should be understood that the invention is not limited to the above-described embodiment, but may be modified into various forms on the basis of the spirit of the invention. Additionally, the modifications are included in the scope of the invention.

What is claimed is:

1. An ion implanter comprising:
   a beamline unit comprising:
      a beam deflector capable of deflecting an ion beam in an x direction;

a beam scanner disposed downstream of the beam deflector and capable of deflecting the ion beam in the x direction in a reciprocating manner to scan the ion beam; and a beam collimator disposed downstream of the beam scanner and comprising a collimating lens that collimates the scanned ion beam in a z direction, the collimating lens having a focus at a scan origin of the beam scanner, wherein the beamline unit contains a reference trajectory of the ion beam, the z direction represents a direction along the reference trajectory, and the x direction represents a direction perpendicular to the z direction; and a controller that controls at least the beam deflector of the beamline unit, wherein the controller corrects an x-direction deflection angle in the beam deflector so that an actual trajectory of the ion beam deflected by the beam deflector intersects with the reference trajectory at the scan origin on an xz plane.

2. The ion implanter according to claim 1, wherein the beamline unit comprises a beamline upstream part, a beamline middle part disposed downstream of the beamline upstream part, and a beamline downstream part disposed downstream of the beamline middle part, wherein the beamline upstream part comprises an ion beam generation unit that generates the ion beam and a high energy multistage linear acceleration unit that accelerates the ion beam, wherein the beamline middle part comprises a plurality of deflection electromagnets including at least one energy analysis electromagnet and at least one steering electromagnet disposed downstream of the at least one energy analysis electromagnet, wherein the beamline downstream part comprises the beam scanner and the beam collimator, wherein the beam deflector is the at least one steering electromagnet.

3. The ion implanter according to claim 2, further comprising a beam monitor disposed downstream of the beam collimator to measure an x-direction implantation angle to a workpiece, wherein the controller corrects a magnetic field in the steering electromagnet based on the measured x direction implantation angle so that the actual trajectory of the ion beam intersects with the reference trajectory at the scan origin.

4. The ion implanter according to claim 2, wherein the at least one steering electromagnet comprises a power supply unit having magnetic field setting precision and magnetic field stability of $1\times10^{-4}$ or less.

5. The ion implanter according to claim 2, wherein the at least one steering electromagnet comprises: a main coil for trajectory deflection comprising a main coil power supply; and a sub coil for deflection angle correction comprising a sub coil power supply, wherein the sub coil power supply is controllable independently from the main coil power supply, wherein the controller controls the sub coil so that the actual trajectory of the ion beam intersects with the reference trajectory at the scan origin.

6. The ion implanter according to claim 2, wherein the plurality of deflection electromagnets is arranged to deflect the ion beam accelerated by the high energy multistage linear acceleration unit at approximately 180°.

7. The ion implanter according to claim 2, wherein the plurality of deflection electromagnets consists of one energy analysis electromagnet and one steering electromagnet.

8. The ion implanter according to claim 7, wherein the energy analysis electromagnet is arranged to deflect the ion beam at approximately 90° and the steering electromagnet is arranged to deflect the ion beam at approximately 90°.

9. The ion implanter according to claim 2, further comprising a magnetic field measurement device that measures a magnetic field in the steering electromagnet, wherein the magnetic field measurement device is calibrated in a state in which the magnetic field in the steering electromagnet is corrected so that the actual trajectory of the ion beam intersects with the reference trajectory at the scan origin.

10. The ion implanter according to claim 1, wherein the beamline unit comprises a beamline upstream part and a beamline downstream part disposed downstream of the beamline upstream part, wherein the beamline upstream part comprises an ion source and a mass analyzer, wherein the beamline downstream part comprises a beam focusing/defocusing device disposed upstream of the beam scanner to adjust focusing or defocusing of the ion beam, the beam scanner, and the beam collimator, wherein the beam focusing/defocusing device comprises the beam deflector.

11. The ion implanter according to claim 10, wherein the beam focusing/defocusing device comprises at least one quadrupole lens, wherein the quadrupole lens comprises a pair of electrodes opposed to each other in the x direction and a power supply unit applying different potentials to the respective electrodes.

12. The ion implanter according to claim 11, further comprising a beam monitor disposed downstream of the beam collimator to measure an x-direction implantation angle to a workpiece, wherein the controller corrects a potential difference between the electrodes based on the measured x-direction implantation angle so that the actual trajectory of the ion beam intersects with the reference trajectory at the scan origin.

13. The ion implanter according to claim 1, wherein the beamline unit comprises a beamline upstream part and a beamline downstream part disposed downstream of the beamline upstream part, wherein the beamline upstream part comprises an ion source and a mass analyzer, wherein the beamline downstream part comprises the beam deflector, the beam scanner, and the beam collimator.

14. The ion implanter according to claim 1, wherein a correction amount of the x-direction deflection angle in the beam deflector is set to cause an x-direction implantation angle error to the workpiece to fall within a specification as a result of a single correction.

15. The ion implanter according to claim 1, wherein the beam scanner compensates an intersection angle between the actual trajectory of the ion beam and the reference trajectory by deflecting the ion beam in a reciprocating manner at a total deflection angle of a periodically changing deflection angle for scan and a constant deflection angle corresponding to the intersection angle.

16. An ion implantation method comprising:

deflecting an ion beam in an x direction by using a beam deflector;

scanning the deflected ion beam in the x direction by using a beam scanner; and
collimating the scanned ion beam in a z direction by using a collimating lens,
wherein the x direction is one direction perpendicular to the z direction, and the z direction is a direction along a reference trajectory of the ion beam,
wherein the beam scanner deflects the deflected ion beam in the x direction in a reciprocating manner to scan the deflected ion beam,
wherein the collimating lens has a focus at a scan origin of the beam scanner,
wherein an x-direction deflection angle in the beam deflector is corrected so that the deflected ion beam intersects with the reference trajectory at the scan origin on an xz plane.

* * * * *